United States Patent
Yamamoto et al.

(10) Patent No.: US 7,065,864 B2
(45) Date of Patent: Jun. 27, 2006

(54) METHOD FOR COMPONENT MOUNTING

(75) Inventors: Hiroki Yamamoto, Kofu (JP); Shigeki Imafuku, Nakakoma-gun (JP); Keizo Izumida, Arlington Heights, IL (US); Takeshi Kuribayashi, Nakakoma-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 366 days.

(21) Appl. No.: 10/149,024

(22) PCT Filed: Dec. 7, 2000

(86) PCT No.: PCT/JP00/08639

§ 371 (c)(1),
(2), (4) Date: Sep. 4, 2002

(87) PCT Pub. No.: WO01/43523

PCT Pub. Date: Jun. 14, 2001

(65) Prior Publication Data

US 2003/0056363 A1    Mar. 27, 2003

(30) Foreign Application Priority Data

Dec. 7, 1999  (JP)  .................................. 11/347565
Mar. 31, 2000 (JP)  ............................... 2000-097965

(51) Int. Cl.
*B23P 19/00*  (2006.01)

(52) U.S. Cl. .................. 29/743; 29/712; 29/721; 29/739; 29/831; 29/834; 294/64.1; 414/752.1

(58) Field of Classification Search .......... 29/831–834, 29/712, 720, 739–743, 759, 760, DIG. 44, 29/72, 721; 294/64.1; 414/752.1; 700/108, 700/117, 121
See application file for complete search history.

(56) References Cited

U.S. PATENT DOCUMENTS

| | | | | |
|---|---|---|---|---|
| 4,905,370 A | * | 3/1990 | Hineno et al. | 29/740 |
| 5,457,874 A | * | 10/1995 | Yonezawa et al. | 29/743 |
| 5,566,447 A | * | 10/1996 | Sakurai | 29/832 |
| 5,742,396 A | * | 4/1998 | Kazem-Goudarzi et al. | 356/394 |
| 6,519,838 B1 | * | 2/2003 | Okuda et al. | 29/740 |

FOREIGN PATENT DOCUMENTS

| | | |
|---|---|---|
| CN | 1216673 | 5/1999 |
| EP | 0 851 728 | 7/1998 |
| JP | 1-120897 | 5/1989 |
| JP | 9-83198 | 3/1997 |
| JP | 10-154899 | 6/1998 |
| WO | 97/39613 | 10/1997 |

* cited by examiner

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

There are provided a method and apparatus of component mounting capable of avoiding damage caused by production operations with a component holder having debris thereon. If it is determined during a detecting step of a component holding condition that a component is held by a component holder in an improper condition for mounting, the component holder releases such a component into a collecting box, and skips a pick up operation at a next round of a pick up station. The component holder is then subjected to confirming whether any debris exists by using, preferably, a condition sensor, and the component holder picks up a new component if it is confirmed that no debris exists. If debris is found during the confirming step, production operations are stopped, or a warning is generated. After maintenance of the component holder is completed, production operations are restarted.

10 Claims, 11 Drawing Sheets

< Prior Art >

METHOD FOR COMPONENT MOUNTING

This application is a National Stage Application of PCT/JP00/08639, filed Dec. 7, 2000.

BACKGROUND OF THE INVENTION

The present invention relates to a method for mounting components, such as electronic components, onto a circuit substrate, such as an electronic circuit board, as well as an apparatus for mounting components which is capable of performing such a method. The present invention also relates to a computer readable storage medium for performing such a method.

In the field of component mounting for mounting components, such as electronic components, onto a circuit substrate, such as an electronic circuit board, a plurality of supplying devices carrying numbers of components are attached to a component mounting apparatus, and the components are picked up one after another from these supplying devices in a predetermined order. Each component is then detected as to whether it is held by a component holder in a proper condition for mounting. If it is determined that the component is held in a proper condition, a displacement amount between the component and the component holder is measured. After necessary positional correction is made based on this measured displacement, the component is mounted on a predetermined position of a circuit substrate. If it is determined that the component is held in an improper condition for mounting, or the component is held in a position where proper imaging may not be performed by an imaging device, the component holder does not mount such a component onto a circuit substrate, but rather releases the component at a predetermined station.

The term "circuit substrate" used hereinafter means a material on which electronic components may be mounted. An electronic circuit board is a typical example of the circuit substrate. In these days, however, there are some cases where components are mounted on other types of materials, such as a casing of electronic equipment. Therefore, the term "circuit substrate" used in this specification includes any other types of materials onto which components may be mounted.

Based on a market demand for smaller and lighter electronic devices in recent years, density of components mounted on a circuit substrate has become higher, and hence a space between the components mounted adjacently becomes narrower, and a size of a component itself becomes smaller. For a purpose avoiding any damage to adjacent components already mounted on a circuit substrate, more severe control of a holding condition of a component by the component holder is required. Further, a tip of a nozzle, or a component holder, for sucking a component tends to be designed as small as possible so as not to interfere with a component already mounted, when the nozzle approaches the circuit substrate for mounting a subsequent component.

A conventional component mounting apparatus is now described by referring to FIGS. 5 to 7. FIG. 5 shows an overall view of the component mounting apparatus. Referring to FIG. 5, the component mounting apparatus includes a main body 1 and a component supply 2. A series of component mounting operations are performed inside the main body 1, which includes picking up a component supplied to the component supply 2, and mounting the component onto a circuit substrate supplied from one side of the main body 1.

FIGS. 6(A) and 6(B) show perspective views of a reel carrying numbers of components, and a cassette or a supplying device, respectively, used for supplying components to the component supply 2. In FIG. 6(A), numbers of components 3 are contained in a tape 4 by having a definite space 5 between adjacent components, and the tape 4 is wound on a reel 6. The reel 6 is then rotatably attached to the component supply device, or a cassette 7 as shown in FIG. 6(B). The cassette 7 moves forward the tape 4 intermittently for a distance equivalent to the space 5 so that the components 3 are placed at a component pick up window 9 one after another. Normally, a plurality of cassettes 7 are attached to the component supply 2 of the component mounting apparatus, as seen in FIG. 5. The component supply 2 is driven back and forth in an X direction shown in FIG. 5 by a motor, so that the cassette 7 carrying the components to be picked up may be positioned at the predetermined picking up station. Although a cassette type of the component supply device is illustrated in FIGS. 6(A) and 6(B), some other types, such as a bulk feeder type to supply components using compressed air, or a tray type to supply components by arranging components on a flat tray, may be used.

FIG. 7 schematically shows a series of component mounting operations, from picking up a component to mounting the same onto a circuit substrate, all of which are performed inside the main body 1 of the component mounting apparatus shown in FIG. 5. The cassette 7, or a supplying device, is attached to the component supply 2 at the right hand side of a Y direction of FIG. 7. As described above, components 3 are supplied one by one from the reel 6 attached to the cassette 7 to the pick up window 9 by an operation of a lever 8. On another side of the Y direction of the drawing, an element 10 is located inside the main body 1. As a main portion of the element 10, an index 11 holds a plurality of placement heads 12 on its circumference, which are used for mounting components onto a circuit substrate. As the index 11 is rotated intermittently in a direction shown by an arrow 13 by virtue of a motor, each placement head 12 is rotated and shifted in its position sequentially. A nozzle 14, or a component holder, is capable of moving up and down in a Z direction of the drawing, and is capable of rotating around a central axis parallel to a Z axis of the drawing, each of which is driven by a motor. Piping is connected to each nozzle to supply a vacuum and compressed air for sucking and releasing a component. A circuit substrate 21 is supplied to the main body 1 by a feeder, and held firmly by a circuit substrate holder, not shown in the drawing, and is capable of moving both in X and Y directions of the drawing by virtue of motors.

Again referring to FIG. 7, a nozzle 14 positioned at pick up station 15 sucks a component 3 from the pick up window 9 of the cassette 7 by virtue of a vacuum. The nozzle 14 then moves next to detecting station 16 by a next intermittent rotation of the index 11, where a holding condition of the component 3 is detected by a condition sensor 17. When the index 11 rotates further, the nozzle 14 moves next to imaging station 18, where a sucking point of the component 3 is recognized by an imaging device 19. With a further intermittent rotation of the index 11, the nozzle 14 is moved to mounting station 20 where the nozzle 14 moves down in the Z direction of the drawing, and mounts the component 3 on the predetermined mounting position of the circuit substrate 21. The circuit substrate 21 may be moved by the circuit substrate holder in both X and Y directions in accordance with predetermined mounting positional data (by virtue of an NC program).

When the condition sensor 17 determines that the component 3 is not in a proper condition for mounting, the nozzle 14 does not mount such a component 3 at mounting station 20, but rather, releases it into a collecting box 23 when the nozzle 14 moves next to releasing station 22. Each of the plurality of nozzles 14 attached to each placement head 12 performs operations of sucking, mounting, and, if necessary, releasing component 3 synchronously in accordance with intermittent rotation of the index 11. Reference numerals 26 and 25 in FIG. 7 are a controller for determining a component holding condition, and a controller for recognizing a component sucking point and measuring displacement, respectively. In FIG. 7, components 3 shown at and after the detecting station 16 are illustrated somewhat oversized for a purpose of easier understanding.

Next, an outline of a method for determining a holding condition of a component is described by referring to FIG. 8. A holding condition of component 3 sucked by nozzle 14 is detected, for example, by a line sensor 17 projecting beams from a projection side 28 toward a receiving side 29. As shown in this figure, if a height of the component 3 held by the nozzle 14 falls within a predetermined allowance $\Delta h$ compared to a targeted height h1 (h1=nozzle height h2−thickness of the component 3), in other words, if the relation $$(h1-\Delta h) < h1 < (h1+\Delta h)$$

is satisfied, it is determined that the nozzle 14 holds a correct component 3 intended to be picked up, and that the component 3 is in proper condition for mounting. To the contrary, if detected height h3 satisfies the relationship, $$h3 < (h1-\Delta h)$$

it is determined that component 3 is not in proper condition for mounting (hereinafter, referred to as "an improperly held condition"). If it is determined that the component 3 is in an improperly held condition, that particular component 3 would not be mounted at mounting station 20 of FIG. 7, but rather, the component 3 is released into the collecting box 23 at the releasing station 22. If the nozzle 14 sucks a false component, or a component which is not intended to be picked up, such a false component is detected in a similar manner, and such a false component is also released into the collecting box 23 at the releasing station 22.

FIG. 9 shows a method for measuring a displacement value between a sucking point 31 of the component 3 and a position of the nozzle 14, which is performed at imaging station 18. In this figure, a rectangle in solid lines shows a configuration of a sucked component 3, while a dotted circular line shows the nozzle 14 sucking the component 3. A targeted sucking point of the component 3 may be predetermined based on, for example, a configuration or a center of gravity of the component 3. To make understanding easier, the targeted sucking point in FIG. 9 is located at a center 31 of the component 3. The sucking point of the nozzle 14 may also be predetermined on a nozzle by nozzle basis, but in this case, too, the sucking point is located at a center 32 of the nozzle 14 for easier understanding. The imaging device 19 provided at the imaging station 18 of the index 11 rotation shown in FIG. 7 images the component 3 sucked by the nozzle 14 from its bottom, and recognizes the center 31 of the component 3 as shown in FIG. 9. Since the center 32 of the nozzle 14 is previously known, displacement values in X direction ($\Delta x$) and Y direction ($\Delta y$) between the center 32 of the nozzle 14 and the center 31 of the component 3 are measured, whereby a total displacement value $\Delta a$ may be measured.

Tilt angle of the component 3 held by the nozzle 14 is also recognized at imaging station 18. For example, if the component 3 is tilted against X and Y axes of the drawing, such tilt angle $\alpha$ may be recognized by the imaging device 19.

Operations of the conventional component mounting apparatus are now described by referring to FIG. 10. When production operations are started during step #901, a circuit substrate 21 is transported into the apparatus and firmly held by the circuit substrate holder during step #902. Also, a component 3 is picked up from the component supply 2 during step #903. During step #904, a holding condition of the component 3 is detected by the condition sensor 17 at the detecting station 16, and the controller 25 for determining the component holding condition determines whether the component is held in a proper condition or not, based on this detection. If it is determined that the holding condition of the component 3 is within an allowable range for mounting, work flow goes to step #905 during which center 31 of the component 3, or a targeted sucking point, is recognized, and then displacement value $\Delta a$ (see FIG. 9) between the center 31 of the component 3 and center 32 of the nozzle 14, or a targeted point of the nozzle 14, is measured. Further, tilt angle $\alpha$ (see FIG. 9) of the component 3 is also recognized. If these measurements are made properly during step #906, necessary correction to position and/or angle of the component 3 is made based on the measured displacement value $\Delta a$ and the tilt angle $\alpha$. After the circuit substrate 21 is positioned at a proper place of the mounting station 20 during step #907, the component 3 is mounted onto the substrate during step #908. Then, during step #909, it is checked whether this component is a last one to be mounted on that particular circuit substrate or not; in other words, it is checked whether all necessary components 3 are already mounted on that circuit substrate 21 or not. If it is confirmed that all the components were mounted, then, during step #910, it is checked whether this circuit substrate 21 is a final one of a current production lot or not, and if it is confirmed that the circuit substrate 21 is the final one, production operations are completed after the circuit substrate 21 is pulled from the apparatus during step #911.

If it is determined during a detecting operation during step #904 that no component is sucked, a mounting operation is skipped at mounting station 20, and a new component is picked up during step #903 at a next round of index 11 rotation. If it is determined during this component detecting process during step #904 that the component 3 is in an improperly held condition, or the component is a false one, such a component 3 is released into the collecting box 23 at releasing station 22 during step #912, and a new component is picked up during step #903 at a next round of index 11 rotation.

If it is determined, during step #909, that the component 3 just mounted is not the last one to be mounted, or there are still other component(s) to be mounted on the same circuit substrate, the work flow goes back to step #903 for performing subsequent pick up and mounting operations. If it is determined, during step #910, that the circuit substrate is not the final one for the current production lot, the circuit substrate with mounted components is pulled from the apparatus, and a new circuit substrate 21 is fed into the apparatus during step #902. All these operations are repeated until all necessary production operations are completed.

SUMMARY OF THE INVENTION

Conventional part mounting operations as described above have some drawbacks. Because of recent trends of miniaturization of components, as well as increasing of density of mounted components on a single circuit substrate, a tip surface of a sucking nozzle has become smaller, and this makes it more difficult to confirm whether any debris exists on a tip of the nozzle before a component pick up operation is started, or to confirm whether a component is securely released after it is determined that the component is in an improperly held condition. In the conventional operations, a surface condition of the nozzle tip after the nozzle has released a component may not be checked satisfactorily. Adding a new detecting device, such as a sensor, to the apparatus for a purpose of this checking is also difficult from view points of space and cost.

If the nozzle fails to release a component, such a remaining component, or debris, may interfere with a new component when the nozzle approaches the new component to pick it up. This may damage both of the components, or in an extreme case, the nozzle itself as well. Moreover, if a small portion of a component, or debris, remains at the tip of the nozzle, vacuum power for sucking a component may be lowered, and hence, the component may not be sucked and held in a proper condition, and may cause a problem for mounting operations.

Furthermore, if the nozzle fails to release a component at releasing station 22, and such a component remains at the tip of the nozzle in an unstable condition for the sake of an improper sucking operation, the component may fall on the circuit substrate when the component is transported by the nozzle. This may cause damage to other components already mounted on the circuit substrate, or may cause damage to other nozzles when they perform mounting operations.

The description made above is related to a nozzle type component mounting, which utilizes a vacuum or compressed air for sucking or releasing components, respectively. There are some other types of component mounting which use a mechanical device, such as a chuck. For these other types of mounting, too, it is a problem if a component, held in an improper condition, is not securely released at the releasing station 22.

The present invention, therefore, is made to solve the above mentioned drawbacks, and to provide a method and an apparatus for component mounting which can reliably confirm that a component is securely released from a nozzle after it is determined that the component is, for example, in an improperly held condition. The present invention also provides a method and an apparatus for component mounting which can reliably release a component into a predetermined collecting box.

According to the method and the apparatus of component mounting of the present invention, the aforementioned drawbacks may be solved in a manner such that, after a component holder has released a component and before the component holder picks up a new component, the component holder is subjected to checking as to whether any debris exists at a tip of the component holder. More specifically, the present invention includes the following.

One aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component by the component holder, wherein the method further includes a step of confirming, prior to the step of picking up a new component, whether any debris exists at the component holder after the component holder has released the component held in the improper condition. This is for avoiding any possible negative impact on component mounting operations caused by any debris remaining at the component holder after the component holder has released a component held in an improper condition.

Another aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component with the component holder, wherein the method further includes a step of checking whether any debris exists at the component holder immediately after production operations are started, and before the component holder picks up a first component. This is for avoiding any possible negative impact on component mounting operations by checking the component holder immediately after production operations are started.

Another aspect of the present invention relates to a method, wherein, when debris is found during the step of checking or confirming whether any debris exists at the component holder, the method further includes a step of reconfirming whether any debris exists at the component holder immediately after production operations are restarted upon removal of debris from the component holder, and prior to the step of picking up a new component by the component holder. This is for avoiding any possible negative impact on component mounting operations by reconfirming that debris is removed.

Another aspect of the present invention relates to a method wherein the step of checking, confirming or reconfirming whether any debris exists at the component holder is performed by either one of detecting devices used for detecting a component holding condition.

Another aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component by the component holder, wherein, if a displacement value between the component and the component holder is out of a predetermined allowable range, it is determined that the component is held in an improper condition for mounting. This is to avoid any possible interference between a component already mounted on the circuit substrate and the component holder, by predetermining an allowable range of the above displacement.

Still another aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component by the component holder, wherein a moving speed of the component holder, until it reaches the releasing station for releasing the component, is decelerated if it is determined during the step of detecting the component holding condition that the component is held in an improper condition for mounting. This is to avoid falling of the component from the component holder when it is held in the improper condition.

Still another aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component by the component holder, wherein the method further includes steps of: confirming, prior to picking up a new component by the component holder, whether any debris exists at the component holder after the component holder has released a component held in an improper condition for mounting; picking up a new component by the component holder if it is confirmed that no debris is found during the step of confirming whether any debris exists; stopping production operations if debris is found during the step of confirming whether any debris exists; and picking up a new component by the component holder after the production operations are restarted upon removal of the debris from the component holder where debris was found. This is for avoiding any possible negative impact on component mounting operations by reconfirming that debris is removed from the component holder after the component holder has released the component held in the improper condition.

Another aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component by the component holder, wherein the method further includes steps of: checking whether any debris exists at the component holder immediately after production operations are started and before a first component is picked up; picking up the first component if no debris is found during the step of checking whether any debris exists immediately after production operations are started; stopping production operations if debris is found during the step of checking whether any debris exists immediately after production operations are started; picking up a new component by the component holder after the production operations are restarted upon removal of debris from the component holder when such debris was found. This is for avoiding any possible negative impact on component mounting operations by checking whether any debris remains at the component holder immediately after production operations are started.

Still another aspect of the present invention relates to a method of component mounting performing a series of production operations including steps of: picking up a component, supplied to a component supply, by a component holder; detecting a holding condition of the component held by the component holder; mounting the component on a mounting position of a circuit substrate by the component holder if it is determined during the detecting step that the component is held in a proper condition for mounting; and releasing the component at a releasing station instead of mounting it if it is determined during the detecting step that the component is held in an improper condition for mounting, and then picking up a new component by the component holder, wherein the method further includes steps of: comparing a displacement value between the component and the component holder with a predetermined allowable range of displacement, prior to detecting the holding condition of the component; correcting a position of the component based on the displacement, and mounting the component on the mounting position of the circuit substrate, if the displacement between the component and the component holder falls within the allowable range of the displacement; and releasing the component at the releasing station, instead of mounting the component onto the circuit substrate, if the displacement between the component and the component holder is out of the allowable range of the displacement. This is for improving density of components mounted on a circuit substrate by predetermining an allowable range of the above displacement.

Another aspect of the present invention relates to a component mounting apparatus comprising: a supplying device for supplying components to a component supply; a placement head for picking up a component from the component supply, and mounting the component onto a circuit substrate which is positioned and firmly held; a detecting device for detecting a holding condition of the component held by a component holder attached to the placement head; a collecting box for collecting components if it is determined by the detecting device that these components are held in an improper condition for mounting; and a transferring device for transferring the placement head to at least stations of picking up components, detecting the component holding condition, mounting the component onto the circuit substrate, and collecting components, wherein the component mounting apparatus has a controller which controls production operations so as to perform a confirming operation for confirming whether any debris exists at the component holder of the placement head by use of the detecting device, after the placement head has released the component held in an improper condition for mounting and before the placement head picks up a new component.

Still another aspect of the present invention relates to a component mounting apparatus comprising: a supplying device for supplying components to a component supply; a placement head for picking up a component from the component supply, and mounting the component onto a circuit substrate which is positioned and firmly held; a detecting device for detecting a holding condition of the component held by a component holder attached to the component placement head; a collecting box for collecting components if it is determined by the detecting device that these components are held in an improper condition for mounting; and a transferring device for transferring the placement head to at least stations of picking up components, detecting component holding conditions, mounting the components onto the circuit substrate, and collecting components, wherein the component mounting apparatus has a controller which controls production operations so as to perform a checking operation as to whether any debris exists at the component holder of the placement head by use of the detecting device, immediately after production operations are started and before the placement head picks up a first component. This is to avoid any possible negative impact on a component mounting operation, by checking whether any debris remains on the component holder immediately after production operations are started.

Another aspect of the present invention relates to a component mounting apparatus, wherein the detecting device recognizes a displacement value between the component and the component holder, and determines that the component is held in an improper condition for mounting if the displacement is out of a predetermined allowable range of displacement. This is for improving density of components mounted on a circuit substrate by predetermining an allowable range of the above displacement.

Another aspect of the present invention relates to a component mounting apparatus further comprising a debris removing device for removing debris from the component holder, which debris removing device cleans the component holder and removes debris from it in case debris is found during the checking or confirming operation, and/or in case the component holder has released the component held in the improper condition for mounting into the collecting box. The above debris removing device comprises any one of an air nozzle to blow compressed air toward the component holder, a vacuum suction nozzle to cause a suction effect in the vicinity of the component holder, a brush like material to clean the component holder, or any combination thereof.

Yet another aspect of the present invention relates to a component mounting apparatus comprising: a supplying device for supplying components to a component supply; a placement head for picking up a component from the component supply, and mounting the component onto a circuit substrate which is positioned and firmly held; a detecting device for detecting a holding condition of the component held by a component holder attached to the component placement head; a collecting box for collecting components if it is determined by the detecting device that these components are held in improper conditions for mounting; and a transferring device for transferring the placement head to at least stations of picking up components, detecting component holding conditions, mounting the components onto the circuit substrate, and collecting components, wherein the component mounting apparatus has a controller which decelerates a moving speed of the placement head equipped with the component holder until the component holder releases a component, held in an improper condition for mounting, into the collecting box. This is to avoid possible falling of the component from the component holder when it is held in the improper condition.

Another aspect of the present invention relates to a computer readable storage medium storing a program for performing operations including steps of: picking up a component from a component supply by a component holder; checking the component as to whether it is held by the component holder in a proper condition for mounting; measuring a displacement between the component holder and a sucking point of the component, making necessary correction of a position based on this measurement, and then mounting the component onto a circuit substrate if it is determined that the component is held in a proper condition for mounting during the checking step; releasing the component into a collecting box, instead of mounting it onto the circuit substrate if it is determined that the component is held in an improper condition for mounting; confirming whether any debris exists at the component holder which has released the component, held in the improper condition, into the collecting box; picking up a new component by the component holder if no debris is found during the confirming step; stopping production operations if debris is found during the confirming step; picking up a new component to be mounted next by the component holder, after production operations are restarted upon removal of debris from the component holder when such debris was found. This is for controlling, by using a computer, operational steps of performing debris removal from the component holder disclosed in the present invention.

The above mentioned computer readable storage medium may store a program performing further operations including steps of: checking whether any debris exists at the component holder immediately after production operations are started and before the component holder picks up a first component from the component supply; picking up a first component by the component holder if no debris is found during the checking step; stopping production operations if debris is found during the checking step; and picking up a component by the component holder, after the production operations are restarted upon removal of debris from the component holder when such debris was found. Alternatively or additionally, the above mentioned computer readable storage medium may store a program performing further operations including steps of: reconfirming whether any debris exists at the component holder immediately after production operations are restarted and before the component holder picks up a new component; picking up a new component with the component holder if no debris is found during the reconfirming step; and stopping production operations if debris is found during the reconfirming step.

DETAILED DESCRIPTION OF THE PREFERRED EMBODIMENTS

The present invention will now be described in more detail by referring to the appended drawings. In the following description, a rotary type component mounting apparatus is used as an example. The rotary type component mounting apparatus has a plurality of placement heads deployed circumferentially around an index which rotates intermittently during operations. Application of the present invention, however, is not limited to this type of component mounting apparatus. The present invention may alternatively be applied to any other type of component mounting apparatus, such as an XY robot type, in which component placement heads are moved both in X and Y directions for picking up and mounting components.

Further, in the following description, a nozzle type component holder is used as an example. A nozzle picks up a component and mounts it onto a circuit substrate by using vacuum and compressed air. The present invention, however, may be applied to any other types of component holders, such as a chuck type which mechanically picks up and mounts a component. Again, in the following description, a circuit substrate is used as an example of a material onto which components are mounted. The present invention, however, may be applied to other types of materials, such as a component itself, or a electronic device case onto which components may be mounted directly.

Figure 1:
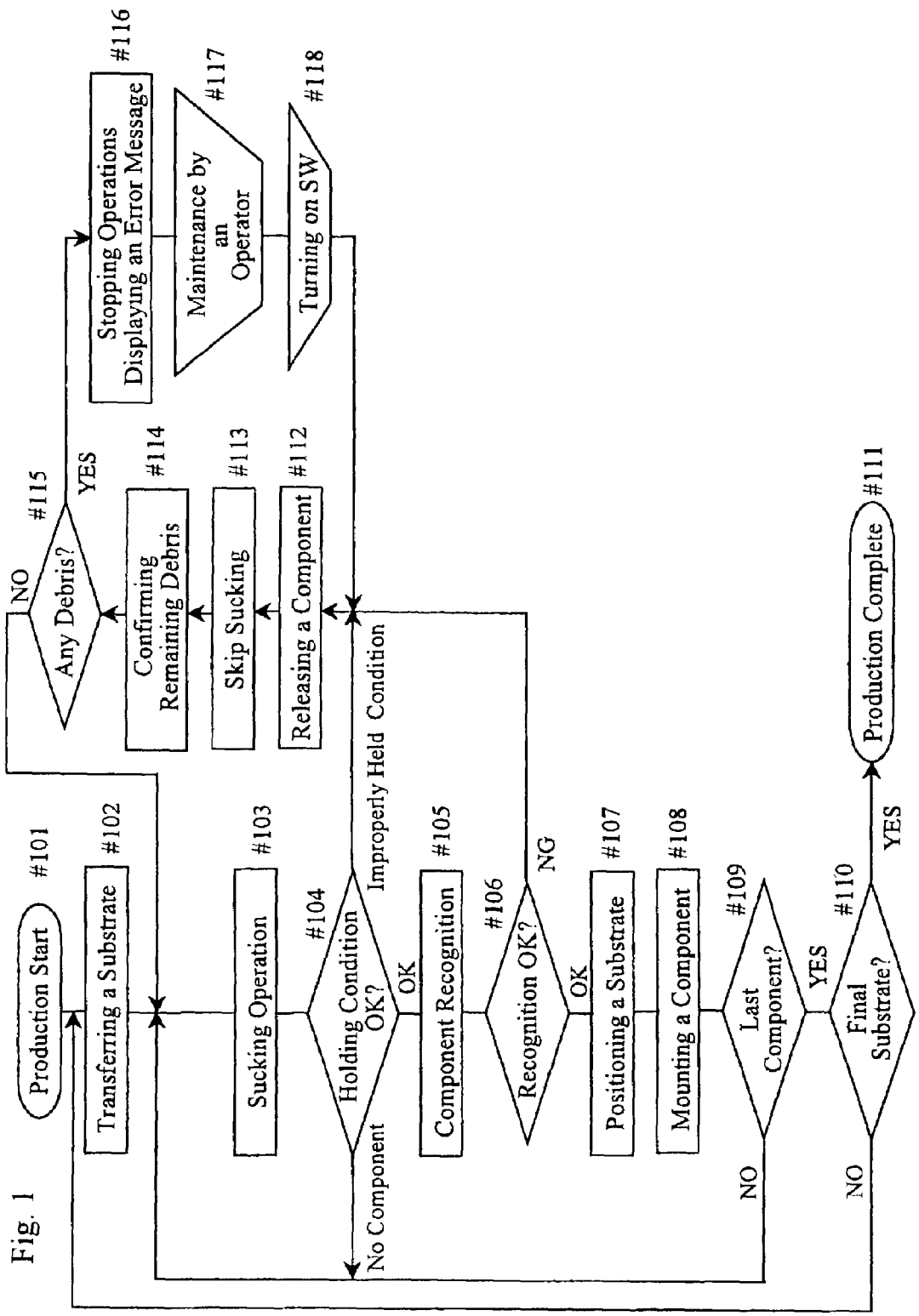
FIG. 1 shows a flowchart illustrating one embodiment of a method of component mounting according to the present invention.

FIG. 1 shows a flow chart of a method of component mounting according to a first embodiment of the present invention. Structures of a main body of a component mounting apparatus performing the method of the present embodiment are similar to those of the prior art described above by referring to FIG. 7. According to the method of the present embodiment, a nozzle which has released a component held in an improper condition is subjected to confirming whether any debris remains and exists at a tip of the nozzle. That particular nozzle is allowed to pick up a new component only if it is confirmed that no debris remains at its tip.

Figure 9:
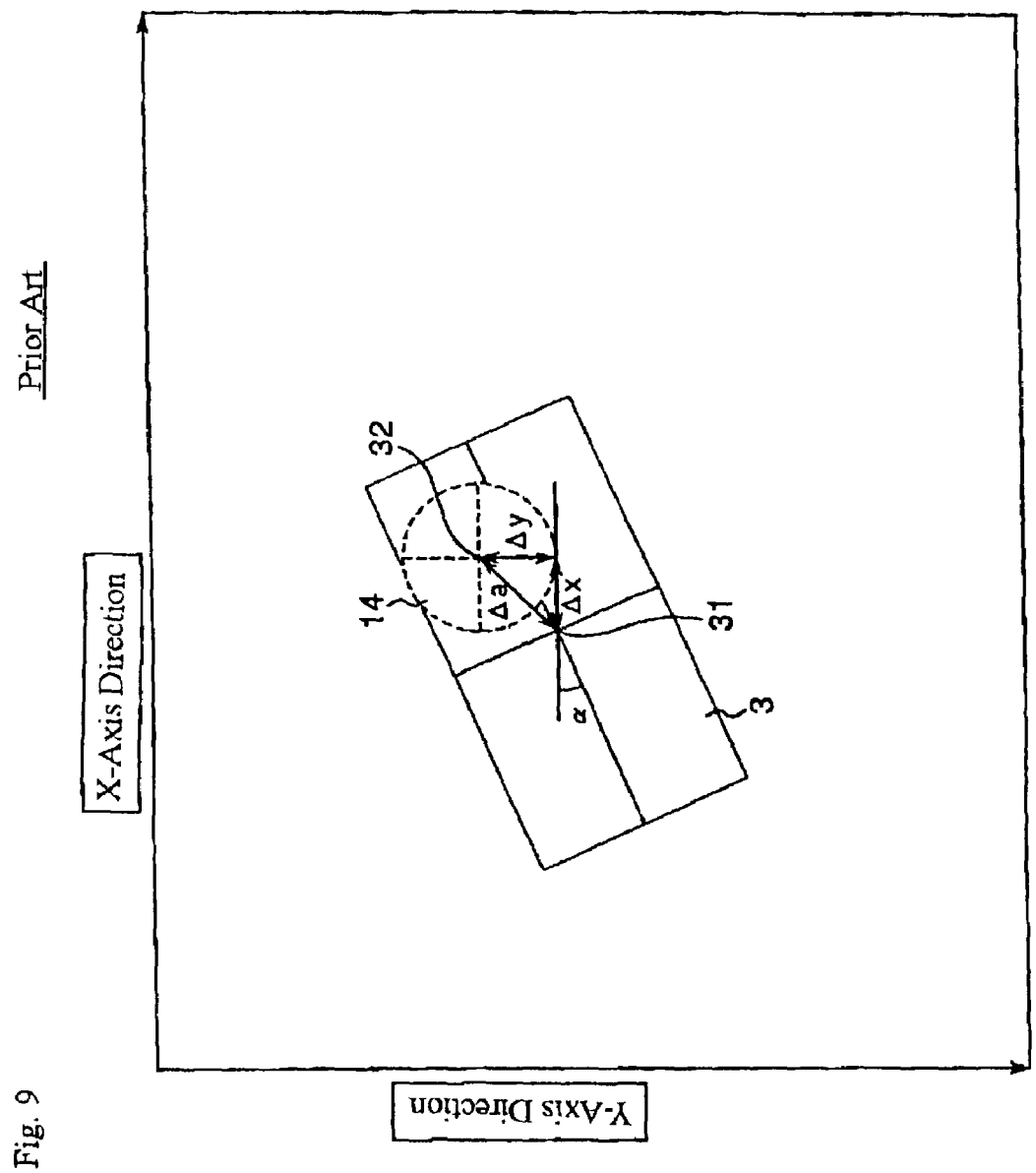
FIG. 9 shows a method of measuring a displacement of a component according to prior art.
Figure 10:
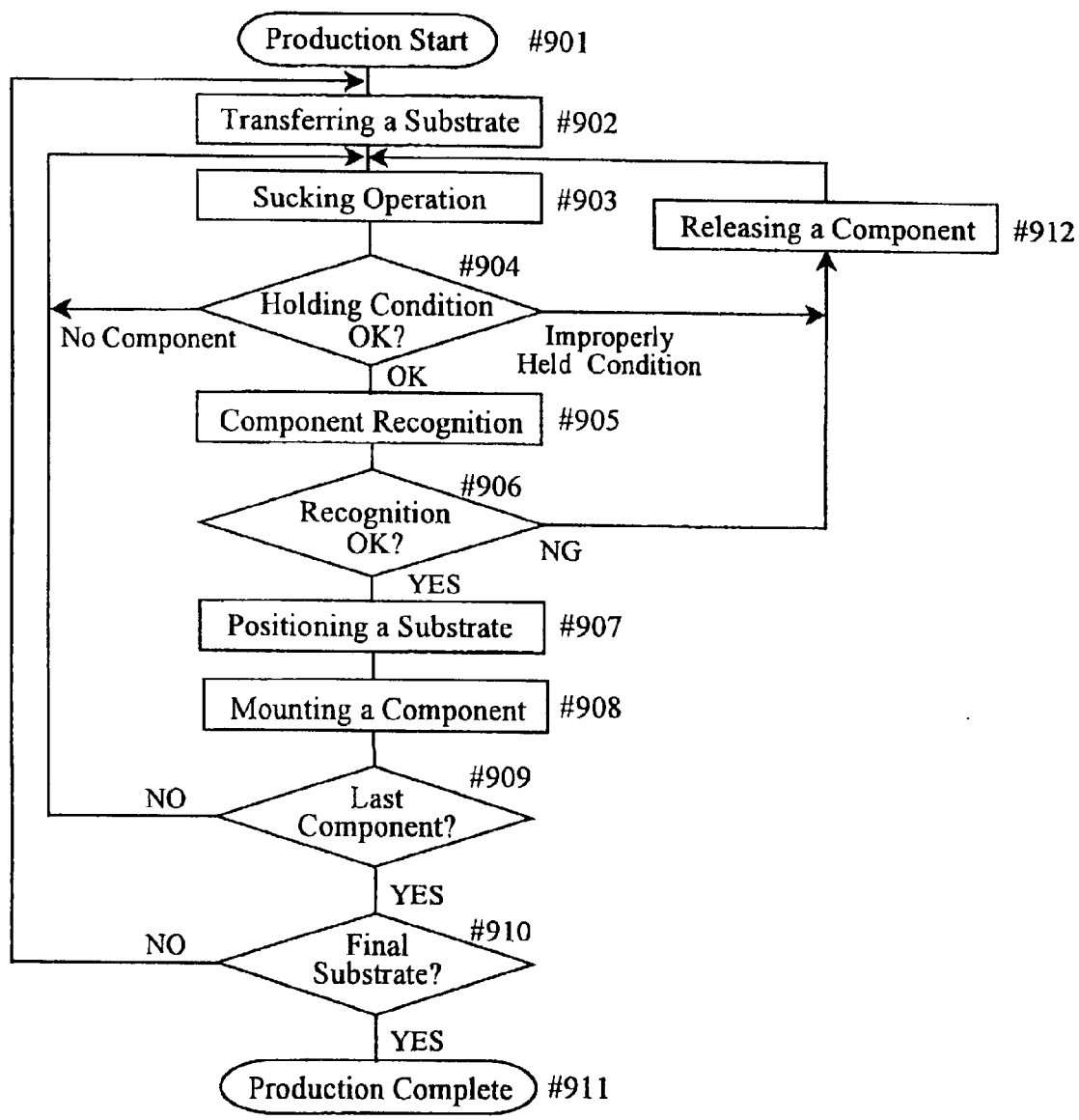
FIG. 10 is a flow chart illustrating a method of component mounting according to prior art.

In the method of component mounting according to the present embodiment shown in FIG. 1, after production operations are started during step #101, a circuit substrate 21 is fed into the apparatus and firmly held by a circuit substrate holder during step #102, and a component 3 is picked up from a component supply 2 during step #103. Then, during step #104, a holding condition of the component 3 is detected by condition sensor 17. If it is determined that the component 3 is held in proper condition for mounting, work flow goes to step #105 where a sucking point of the component is recognized at an imaging station. If it is confirmed that the sucking point is properly recognized, a displacement value Δa (see FIG. 9) between sucking point 31 and nozzle 14, as well as tilt angle α are measured. In this context, both determining a holding condition, and recognizing a holding point and measuring displacement are included in a "detecting holding condition". After necessary correction of position and/or tilt angle is made, the work flow goes to step #107 for positioning circuit substrate 21 at a mounting station, and then the component 3 is mounted on the circuit substrate during step #108. During step #109, it is checked whether the component just mounted is a last one to be mounted on that particular circuit substrate 21 or not, and if it is confirmed that the component is the last one, the work flow goes to #110 where it is checked whether the circuit substrate is a final one for a production lot or not. If it is confirmed that the circuit substrate is the final one, the circuit substrate 21 is pulled out from the apparatus, and production operations are completed.

When it is found that no component is picked up during a holding condition detecting process during step #104, a mounting operation is skipped at next mounting station 20, and work flow goes back to step #103 where a new component is sucked and picked up at pick up station 15 at a next round of index 11 rotation. And if it is determined during the holding condition detecting process during step #104 that the component is in an improperly held condition, or the sucked component is a false one, the work flow goes to step #112 where sucking is terminated at releasing station 22 for releasing the component into collecting box 23. In such a case, a new component 3 is not picked up at pick up station 15 at a next round of index 11 rotation, and instead, a tip of the nozzle 14 is subjected to confirming whether any debris remains on the nozzle 14 by using the condition sensor 17 at detecting station 16 during step #114. During step #115, if it is confirmed that no debris remains at the tip of the nozzle 14, the work flow goes back to step #103, and the nozzle 14 sucks a new component 3 for picking it up.

During step #115, if any debris is found at the tip of the nozzle, production operations of the component mounting apparatus are stopped during step #116, and/or a warning, such as displaying an error message or making an alarm, is generated so as to inform this problem to an operator. During step #117, the operator checks the tip of the nozzle 14 where the debris was found, and performs necessary maintenance work for removing the debris. The operator then turns on the power of the apparatus to restart production operations after confirming that no debris remains. When production operations are restarted, a component releasing operation is performed one more time during step #112, and a component pick up operation is skipped at next round pick up station 15 during step #113, and then, it is reconfirmed whether any debris remains at the nozzle tip during step #114. The above mentioned operations are repeated depending upon results of a reconfirmation process of the nozzle tip condition during step #115.

In case of a rotary type component mounting apparatus, the order of operations performed by nozzles, which are deployed around the circumference of the index 11, is predetermined in association with rotation of the index 11. Therefore, a component pick up operation at a next round of pick up station 15 needs to be skipped during step #113, and possible existence of debris at the tip of the nozzle 14 needs to be checked first at detecting station 16 during step #114. A component pick up operation is started at a next round of index 11 rotation when the nozzle approaches the pick up station 15. In case of an XY robot type component mounting apparatus, on the contrary, it is possible, by modifying a system logic, to first move the nozzle toward detecting station 16 directly for confirming any debris that remains, and then move the nozzle to the component pick up station 15.

In the present embodiment, after the operator checks the nozzle condition during step #117, the work flow goes back to step #112 and a component pick up operation by this particular nozzle 14 is skipped during step #113. A new component may be sucked only after reconfirming no debris remains at the nozzle by the condition sensor 17 during step #114. A reason for this is to avoid any possible failure during a confirmation process conducted by the operator. Since the component may be too small for visual check by the operator, it is recommendable to conduct reconfirmation so as to find any remaining debris by the condition sensor 17. Therefore, in case a component to be mounted is large enough for visual checking, it may be possible to eliminate such reconfirmation process, and the work flow may go back directly to step #103 for resuming a series of mounting operations.

Figure 7:
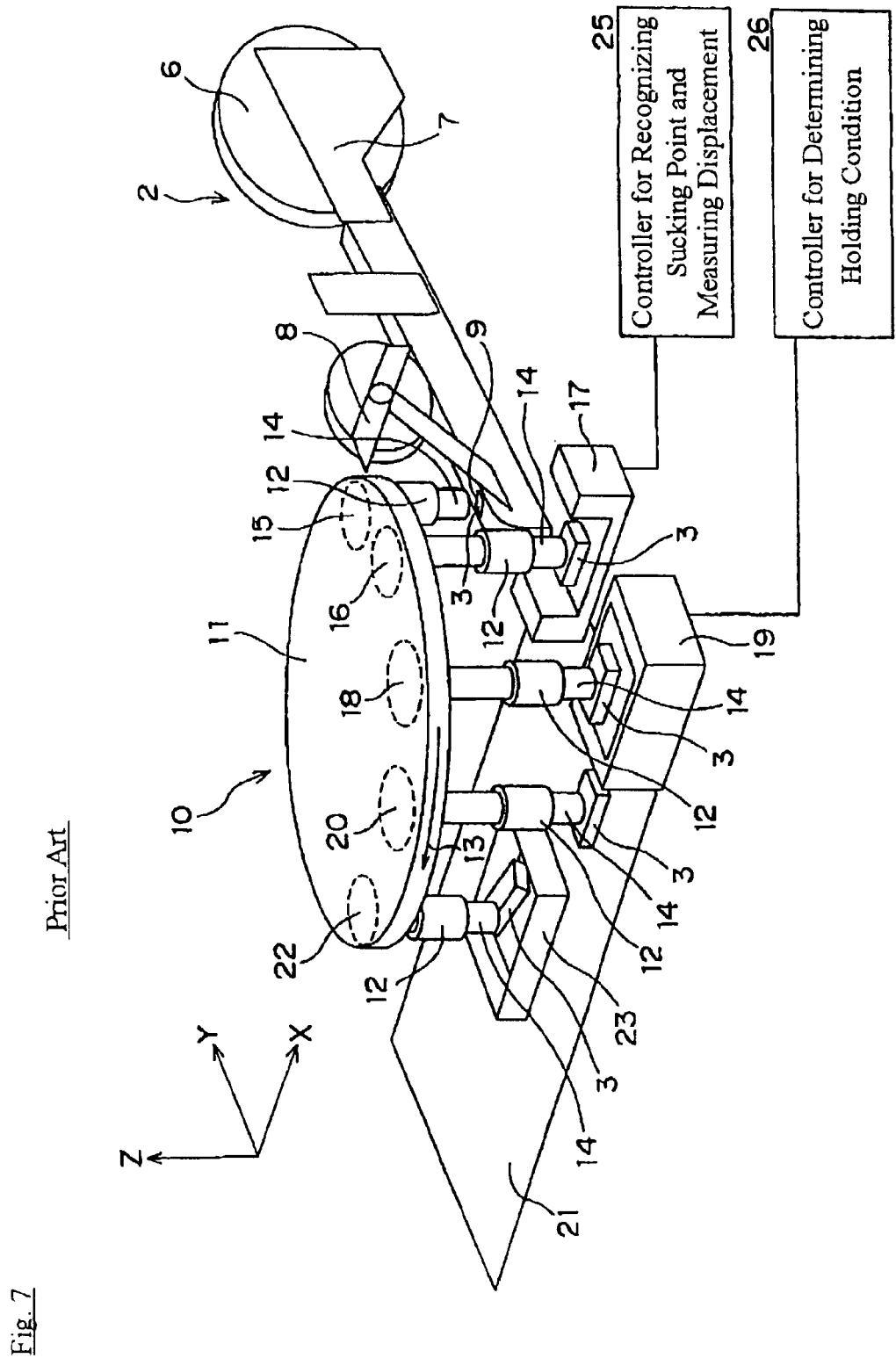
FIG. 7 shows main operating elements located inside of a main body of a component mounting apparatus according to prior art.
Figure 8:
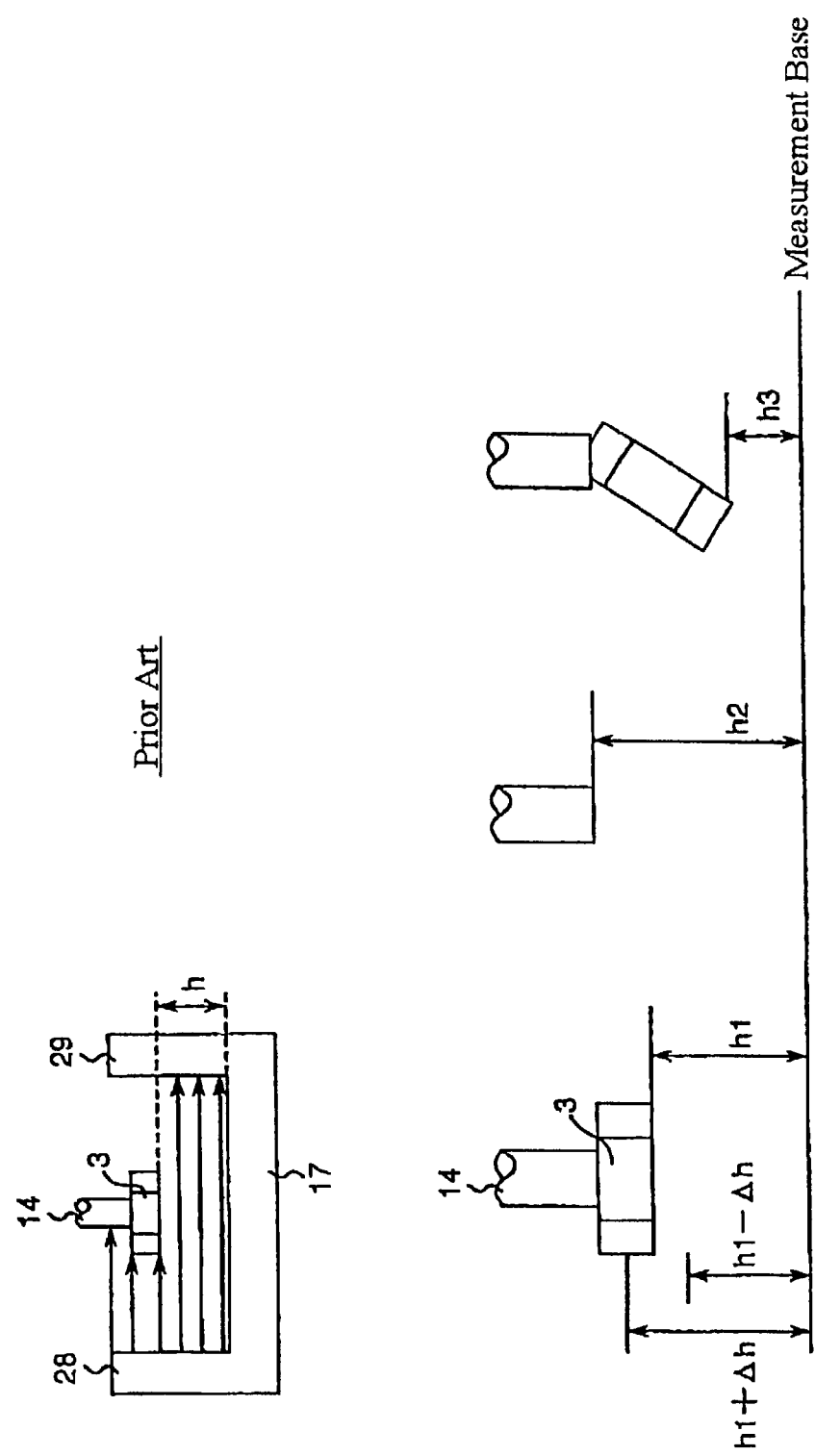
FIG. 8 shows a method of determining a condition of a component held by a component holder according to prior art.

In the present embodiment, structure element 10 as shown in FIG. 7 is used for component mounting operations. Accordingly, a confirming process as to whether any debris remains at a component holder (in this case, a nozzle 14) after release of component 3 may be performed by the condition sensor 17 at detecting station 16. It is extremely preferable to use already existing devices for this purpose provided in the component mounting apparatus, such as the condition sensor 17, since using existing devices would avoid any problems related to additional space and cost. It may also be possible, however, to provide an additional detecting device for this checking or confirmation purpose.

Next, a second embodiment of a method and an apparatus for component mounting according to the present invention will now be described. In the present embodiment, all nozzles are subjected to checking whether any debris exists immediately after production operations are started, and a component pick up operation is started only after this checking procedure is conducted. The term "operation start" here may include any production operation start timing, such as starting a different production lot after production of a specific model has completed, starting production operations after mechanical problems, starting production operations after operators' break time, or starting production operations after operators' shift change. In addition, if it is necessary, detection procedures mentioned above may be performed periodically at a certain time interval during the production operations. The term "immediately after production operations are started" means a timing immediately after starting an operation by, for example, turning on electric power, once the component mounting apparatus has been stopped for any reason such as mentioned above.

Figure 2:
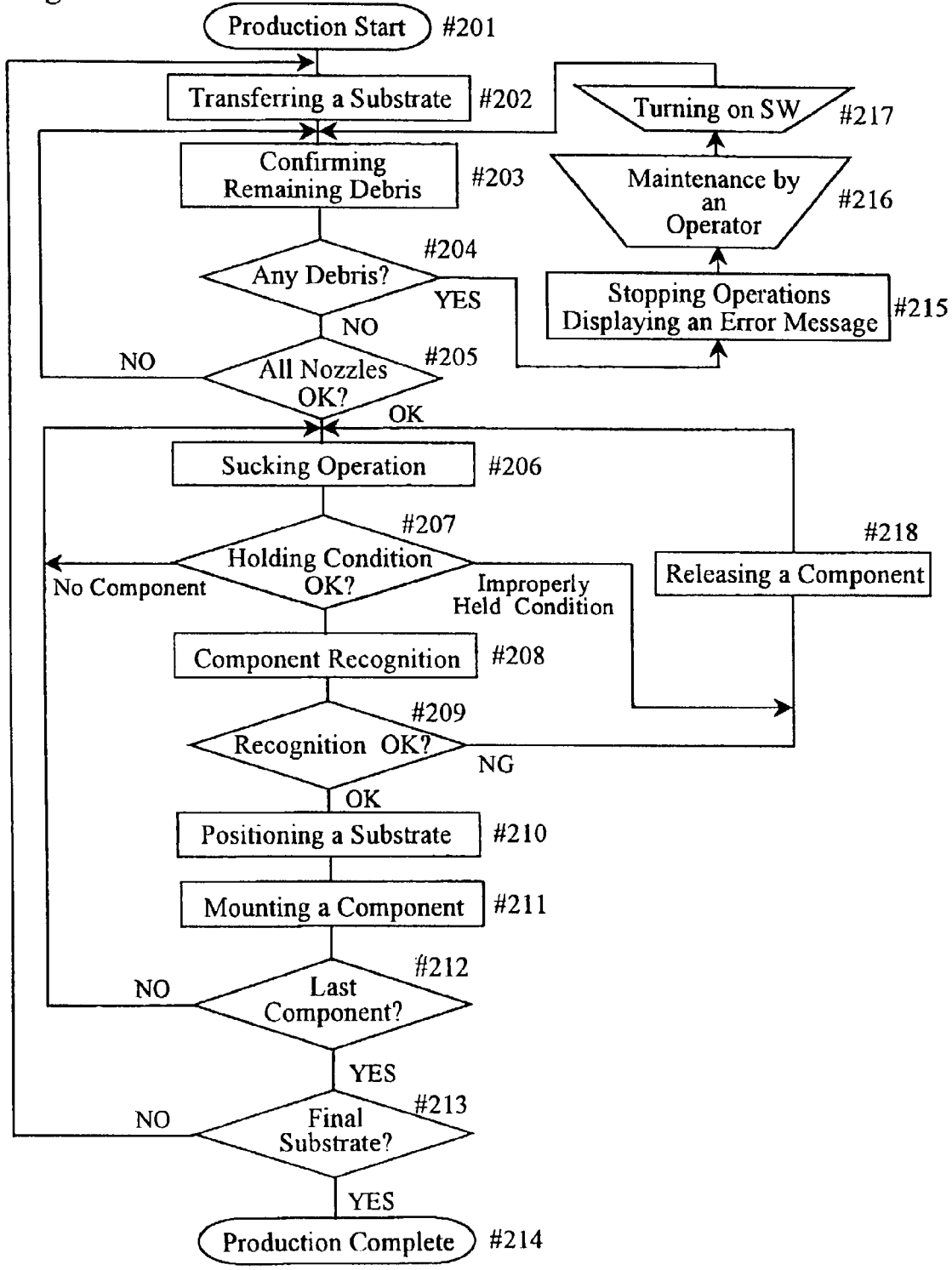
FIG. 2 shows a flowchart illustrating another embodiment of a method of component mounting according to the present invention.

Referring to FIG. 2, after staring production operations during step #201, a circuit substrate is fed in and firmly held by a circuit substrate holder during step #202. Before starting a component pick up operation during step #206, a nozzle 14 is checked as to whether any debris remains and exists on a surface of a tip thereof by using condition sensor 17 at the detecting station 16 during step #203. If no debris is found at the tip of the nozzle 14 during step #204, work flow goes to step #205 to confirm whether all nozzles 14 are checked. If all the nozzles are checked and confirmed that no debris remains at any nozzle, the work flow goes to step #206 for starting a component pick up operation. If not all the nozzles are checked during step #205, the work flow goes back to step #203 to repeat the above checking procedure for finding any debris on other nozzles until all the nozzles 14 are checked.

If debris is found at one of the nozzles 14 during step #204, the work flow goes to step #215 where the component mounting apparatus is stopped, and/or a warning such as displaying error message or making an alarm is generated. During step #216, an operator checks a tip surface of nozzle 14 where the debris was found, and performs necessary maintenance work for removing the debris. And then the operator turns on power of the apparatus during step #217 for restarting production operations upon removal of the debris. After the production operations are restarted, a component pick up operation at pick up station 15 is skipped at a first round of index 11 rotation, and tips of all the nozzles 14 are checked one more time as to whether any debris remains by using condition sensor 17 at detecting station 16. These processes are repeated until it is confirmed, during step #205, that all the nozzles 14 are free from debris.

After it is confirmed that no debris remains at any tips of the nozzles 14 during step #205, a component 3 is picked up during step #206, and a holding condition of the component 3 is checked by condition sensor 17 at detecting station 16 during step #207. If it is determined that the component is held in a proper condition for mounting, a sucking point and tilt angle of the component are recognized at an imaging station during step #208. If the sucking point and the tilt angle are recognized properly, displacement value Δa and the tilt angle α are measured during step #209. Necessary position and/or angle corrections are made to the component based on measurements of the displacement Δa and the tilt angle α. After circuit substrate 21 is positioned at mounting station 20 during step #210, the component 3 is mounted on the circuit substrate 21 during step #211. Next, during step #212, it is checked whether the component just mounted is a last one to be mounted or not, and if it is confirmed that the component is the last one, the work flow goes to step #213 where it is checked whether the circuit substrate is a final one or not. If it is confirmed that the circuit substrate is the final one, the circuit substrate 21 is pulled from the apparatus and the production operations are completed.

If it is found, during step #207, that no component is sucked during a component holding condition detecting process, a next round of a mounting operation is skipped, and the work flow goes back to step #206 for sucking a new component. If it is determined that the component is in an improperly held condition, or a sucked component is a false one, such component 3 is released at releasing station 22 during step #218, and the work flow returns to step #206 for picking up a new component 3.

As described in the first embodiment, order of nozzle operations for rotary type component mounting apparatus is fixed in association with index 11 rotation. As for an XY robot type component mounting apparatus, for example, the nozzles may be arrange to move to detecting station 16 first for finding any debris on nozzle tips, and then move to the pick up station 15 for component pick up by modifying logic of nozzle movement.

As described in the first embodiment, a reason for checking one more time whether or not any debris remains after an operator checked nozzle condition is to avoid any possible failure of this operator's visual check. In case a component is large enough for visual checking, it may be possible to directly go to step #206 to start a component pick up operation, without having such reconfirmation procedure. Further, although an example of the component mounting apparatus shown above has a plurality of nozzles 14, the present invention may be applied to a type having a single nozzle. In such a single nozzle type, if it is confirmed that no debris remains at that nozzle, the work flow may directly go to step #206 for starting component sucking.

The first and second embodiments may be combined. Namely, after starting production operations, all nozzles are checked as to whether any debris remains before a component pick up operation is started, and pick up of a component 3 may be allowed only after confirmation is made that no debris is found. Further, if it is determined that a component is in an improperly held condition, a sucked component is a false one, or a component holding point is not properly recognized, nozzle 14 releases such a component and will not pick up a new component until it is confirmed that no debris remains at a tip of the nozzle by using the condition sensor 17. As described in the first embodiment, although it is preferable to perform the above confirmation procedure for finding any debris at the nozzle 14 by using existing detecting devices, such as the condition sensor 17, it is also possible to conduct such procedure by using an additionally provided detecting device.

Figure 3:
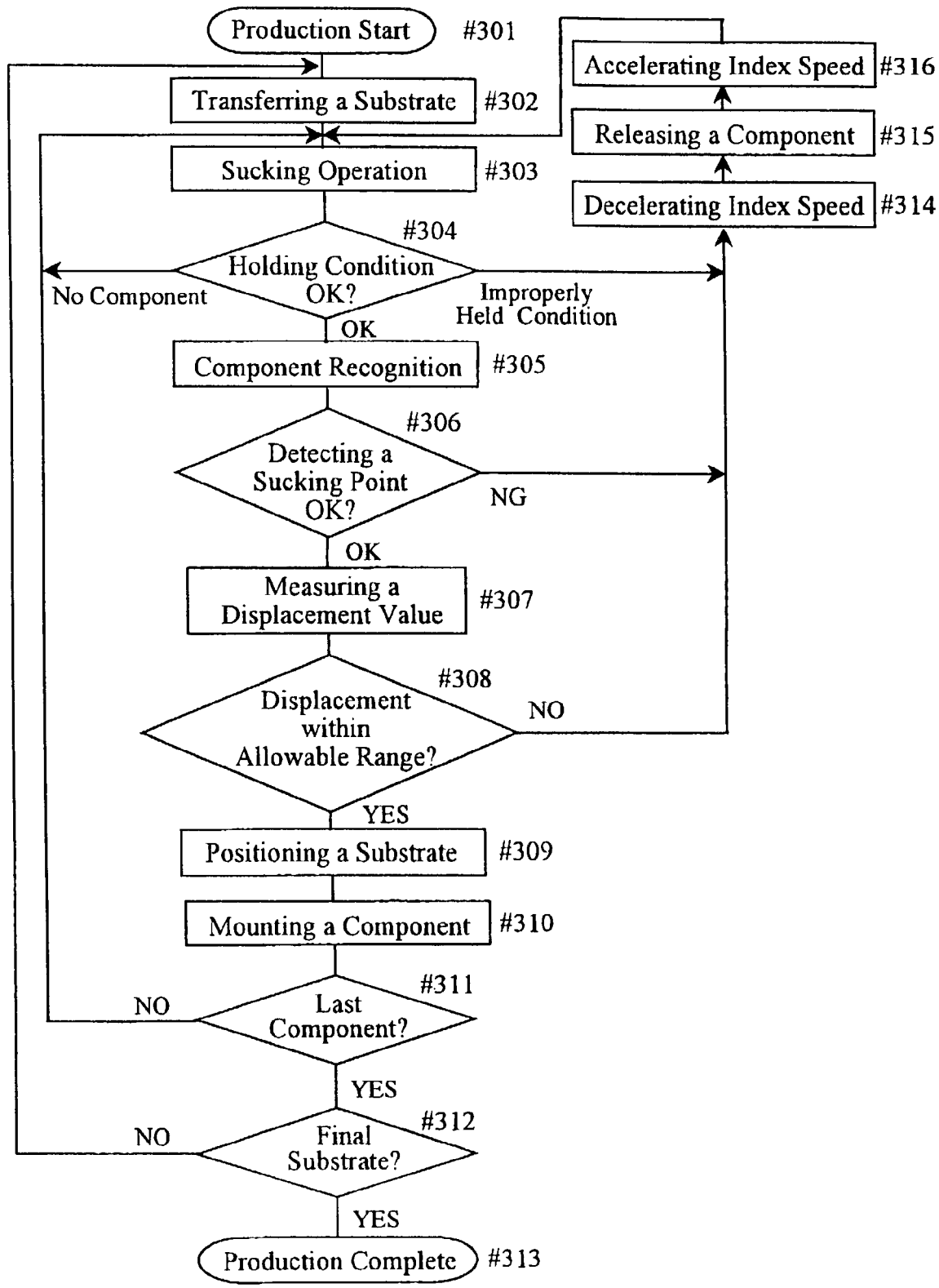
FIG. 3 shows a flowchart illustrating still another embodiment of a method of component mounting according to the present invention.

Next, a method and an apparatus of component mounting according to a third embodiment of the present invention are now described by referring to FIG. 3. According to the method of component mounting of the present embodiment, an allowable range of displacement $\Delta a$ between a sucking point of component 3 and nozzle 14 is predetermined. If this displacement measured is out of such an allowable range, the component 3 is to be released into collecting box 23 at releasing station 22. Further, according to the method of component mounting of the present embodiment, a controller is provided for decelerating a moving speed of the nozzle 14 until the nozzle 14 releases the component 3, in case it is determined that the displacement $\Delta a$ is out of the predetermined allowable range. Decelerating the moving speed of the nozzle is made for a purpose of avoiding any possible falling of the component 3 held in an improper condition, thereby avoiding possible damage to other components already mounted on a circuit substrate, or avoiding negative impact during component mounting operations conducted by other nozzles 14.

Referring to FIG. 3, when production operations are started during step #301, a circuit substrate 21 is fed in and firmly held by a circuit substrate holder during step #302, and component 3 is picked up during step #303. Then, the work flow goes to step #304 for detecting a holding condition of the component 3 using the condition sensor 17 at detecting station 16. If it is confirmed that the holding condition is within a range for proper mounting, the work flow goes to step #305 for recognizing component sucking point 31 and a tilt angle by imaging device 19. If the sucking point 31 and the tilt angle are recognized properly, displacement value $\Delta a$ between the sucking point 31 of the component 3 and the nozzle 14 is measured during step #307. During step #308, it is checked whether measured displacement $\Delta a$ between the sucking point 31 and the nozzle 14 is within the allowable range or not. If the displacement $\Delta a$ falls within the range, necessary correction of position and/or angle are made to the component 3 based on measurement results of the displacement $\Delta a$ and the tilt angle $\alpha$. Then, work flow goes to step 309 where the circuit substrate 21 is positioned at the mounting station 20, and the component 3 is mounted onto the circuit substrate during step #310. Next, during step #311, it is checked whether the component 3 just mounted is a last one to be mounted, and if it is confirmed that the component is the last one, the work flow goes to step #312 for checking whether the circuit substrate 21 is a final one for a production lot or not. If it is confirmed that the circuit substrate 21 is the final one, the circuit substrate 21 is pulled from the apparatus, and the production operations are completed during step #313.

In the prior art, an allowable range of displacement $\Delta a$ between sucking point 31 of component 3 and targeted point 32 of nozzle 14 (see FIG. 9) is given based on a field of an imaging device used for measuring the displacement $\Delta a$. According to such a prior art method, a space between the component 3 to be mounted and components already mounted on the circuit substrate may not be arranged narrower than 0.5 mm. If the allowable range of the displacement is given based on the field of the imaging device, a magnitude of positional correction of the component becomes as large as the field of the imaging device. Therefore, such magnitude of positional correction between the nozzle 14 and the circuit substrate 21 may become too large, so that a tip of the nozzle 14 may interfere with an adjacent component already mounted on the circuit substrate, and may cause damage thereto. To the contrary, according to the method of the present embodiment, as mentioned above, the allowable range of displacement value $\Delta a$ can be selectively predetermined, which may be determined small enough to avoid any interference and/or damage against an adjacent component caused by an approaching nozzle, and to mount a new component properly. The displacement value $\Delta a$ may be selected at any preferred range on a component by component basis, depending upon a layout of the circuit substrate and/or size of a component to be mounted. According to the present method, a space between two adjacent components may be arranged to be as small as 0.2 mm.

If it is determined by the condition sensor 17, during step #304, that no component is sucked, a next component mounting operation is skipped, and the work flow returns to step #303 where a new component is picked up. If it is determined during step #304, that a component is held in an improper condition or the component is a false one, or sucking point 31 is not recognized during step #306, or if it is determined during step #308 that the displacement value $\Delta a$ is out of the allowable range, a speed of the index 11 rotation shown by an arrow 13 (see FIG. 7) for moving nozzles 14 is decelerated, and then component 3 is released into collecting box 23 at releasing station 22 during step #315. After the component 3 is released during step #316, speed of index 11 rotation shown by the arrow 13 is accelerated up to a normal level so as to resume normal production operations.

In case of the rotary type component mounting apparatus as shown above, speed of the nozzle 14 is controlled by index 11 rotation. In case of the XY robot type component mounting apparatus, a similar effect may be achieved by controlling a speed of driving devices which move the nozzle(s) in X and Y directions.

According to a method of the present embodiment shown in FIG. 3, two different procedures, i) procedure of selectively determining an allowable range of displacement value $\Delta a$ between sucking point 31 and nozzle 14, and ii) procedure of decelerating speed of the nozzle 14 until the nozzle 14 releases a component, are incorporated together. These two procedures, however, are completely independent from each other, and, therefore, these two procedures may be applied either jointly or separately.

Further, this third embodiment of the present invention may be applied in conjunction with either the first or second embodiment, or both of them. Namely, after production operations are started, all nozzles 14 are checked, before starting a component pick up operation, as to whether or not any debris exists on tips of nozzles. If no debris is found, a sucking operation by the nozzles 14 is started. If debris is found, a nozzle speed is reduced until it reaches releasing station 22. Further, if it is determined that a component is held in an improper condition for mounting, a sucked component is a false one, or sucking point 31 cannot be recognized, or if it is determined that the displacement value Δa is out of the allowable range, speed of the nozzles 14 is decelerated, and the component 3 is released into the collecting box 23 at releasing station 22. After the component is released, speed of the nozzle is accelerated up to a normal level. After the component 3 is released, that particular nozzle once skips a sucking operation, and the nozzle is checked for confirming whether any debris remains at its tip by using the condition sensor 17 at detecting station 16. If no debris is found, the nozzle 14 starts a component sucking operation.

A fourth embodiment of the present invention is related to a device for removing debris from a component holder. In each of the embodiments described above, if any debris is found at the component holder, an operator once stops operation of a component mounting apparatus, during steps #116, #117 as shown in FIG. 1, removes the debris from the component holder manually by, for example, cleaning, and then restarts operation of the apparatus. According to the present embodiment, instead of the operator's manual work for removing debris, a device for removing such debris automatically is provided, whereby productivity of the component mounting apparatus may be improved.

Figure 11:
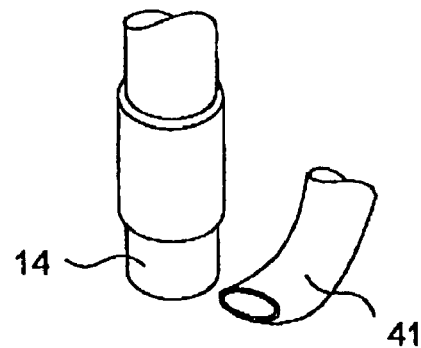
FIGS. 11(A) to 11(C) show examples of debris removing devices of still another embodiment of the present invention.
Figure 11:
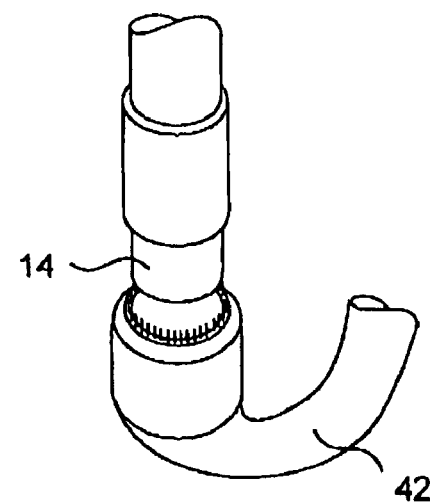
Figure 11:
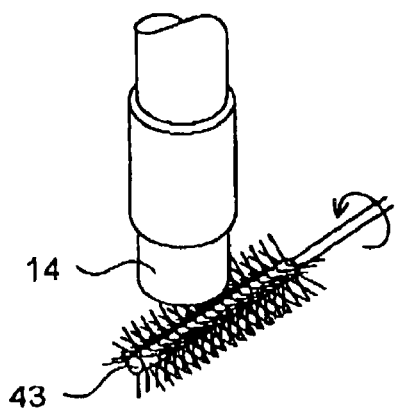

One aspect of such debris removing device, as shown in FIG. 11(A), includes an air nozzle 41 to blow compressed air therefrom. If any debris is found on a component holder, the air nozzle 41 blows compressed air toward the component holder when it approaches nearby. In this instance, the compressed air is blown from a bottom of the component holder 14 obliquely so that the debris removed from the component holder may be blown off toward a direction away from a circuit substrate and/or other component holders 14.

Another aspect of the debris removing device includes a suction nozzle 42 as shown in FIG. 11(B). By locating such a suction nozzle 42 near the component holder 14 and by introducing a vacuum, debris remaining at the component holder 14 may be sucked into the suction nozzle 42. An opening portion of such a suction nozzle 42 may be made of an elastic material such as rubber, so that the component holder 14 and the suction nozzle 42 may not suffer any damage even when both of them collide with each other. Also, by adding brush like elastic material surrounding an opening of the suction nozzle 42, and contacting this material with the component holder, debris may be more easily sucked into this nozzle opening. A benefit of using such a suction nozzle 42 is that debris is more securely removed, and that any damage caused by removed debris, to a circuit substrate and/or other component holders, may reliably be avoided.

Another alternative of the debris removing device is a brush like material 43, such as a wire brush, as shown in FIG. 11(C). By rubbing such a brush like material 43 on a surface of the component holder 14, the component holder 14 may be cleaned and debris may be removed therefrom. In such an instance, it is desirable to move or rotate the brush like material 43 in such a manner that this removed debris may be thrown in a direction away from a circuit substrate and/or other component holders. Further, if it is necessary, a net type material may be provided beneath the brush like material 43 for collecting the removed debris.

If the debris removing device, as described above, is provided at any location between releasing station 22 and pick up station 15 of the index 11 shown in FIG. 7, it becomes possible to collect debris without causing any negative impact on a series of component mounting operations starting from component pick up to either component mounting or component releasing. The aforementioned debris removing device may be arranged in a retracted position during normal operation, and the device may be stretched out only when a component holder, on which debris is found, comes close to the debris removing device. These debris removing devices shown above may be used in any combination thereof.

By providing such debris removing devices, when debris is found, such debris may be removed without stopping the component mounting apparatus, and hence productivity of the component mounting apparatus may be improved. When these kinds of debris removing devices are used for cleaning the component holder, this particular component holder does not pick up a new component at a next round of index rotation, but rather, before restarting a component pick up operation, a nozzle is subjected to confirming whether the debris is actually removed from it at the detecting station 16. By adding such confirmation procedure, any risks caused by possibly remaining debris may be avoided. It is more effective to stop the component mounting apparatus and take necessary maintenance action by an operator only when debris is found with such confirmation procedure. These debris removing devices may be used not only for a case when debris is found at a component holder, but for other cases, such as a case when the component holder releases a component in an improperly held condition. Or these debris removing devices may be used on a regular basis in case, for example, debris is found often during production operations.

If the component holder is a nozzle type for sucking a component, the nozzle itself may be used for removing debris, instead of providing the above mentioned debris removing devices. That is, the nozzle is normally provided with both a vacuum for sucking a component and compressed air for releasing a component. Accordingly, if debris is found on the nozzle, compressed air, which may be at a higher pressure level than compressed air used for a normal releasing operation, is introduced to the nozzle for blowing the compressed air from a nozzle opening, which may be used for removing debris. Since debris normally remains at an outer surface of the nozzle, such blowing of the compressed air from the nozzle opening may be used for removing the debris without additionally providing debris removing devices. Or such a nozzle may be used in combination with any of the debris removing devices mentioned above.

In case the nozzle itself is used for removing debris as described above, it is desirable to provide a debris collecting device, such as a folding net, so that removed debris will not collide with a circuit substrate. Also, it is desirable to reconfirm whether any debris exists on a particular nozzle before the nozzle restarts a component sucking operation.

Figure 4:
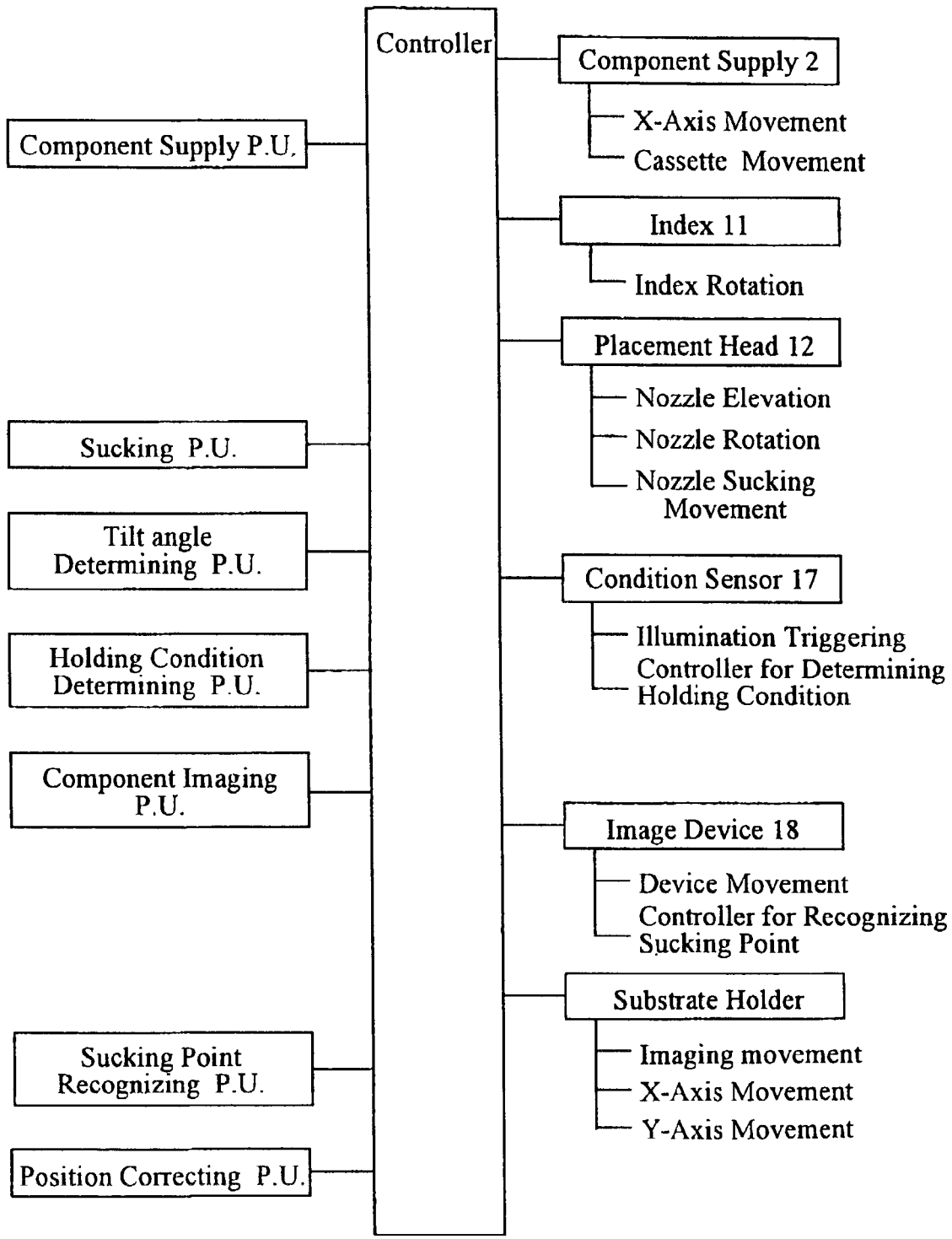
FIG. 4 shows a block diagram illustrating one embodiment of a component mounting apparatus according to the present invention.
Figure 5:
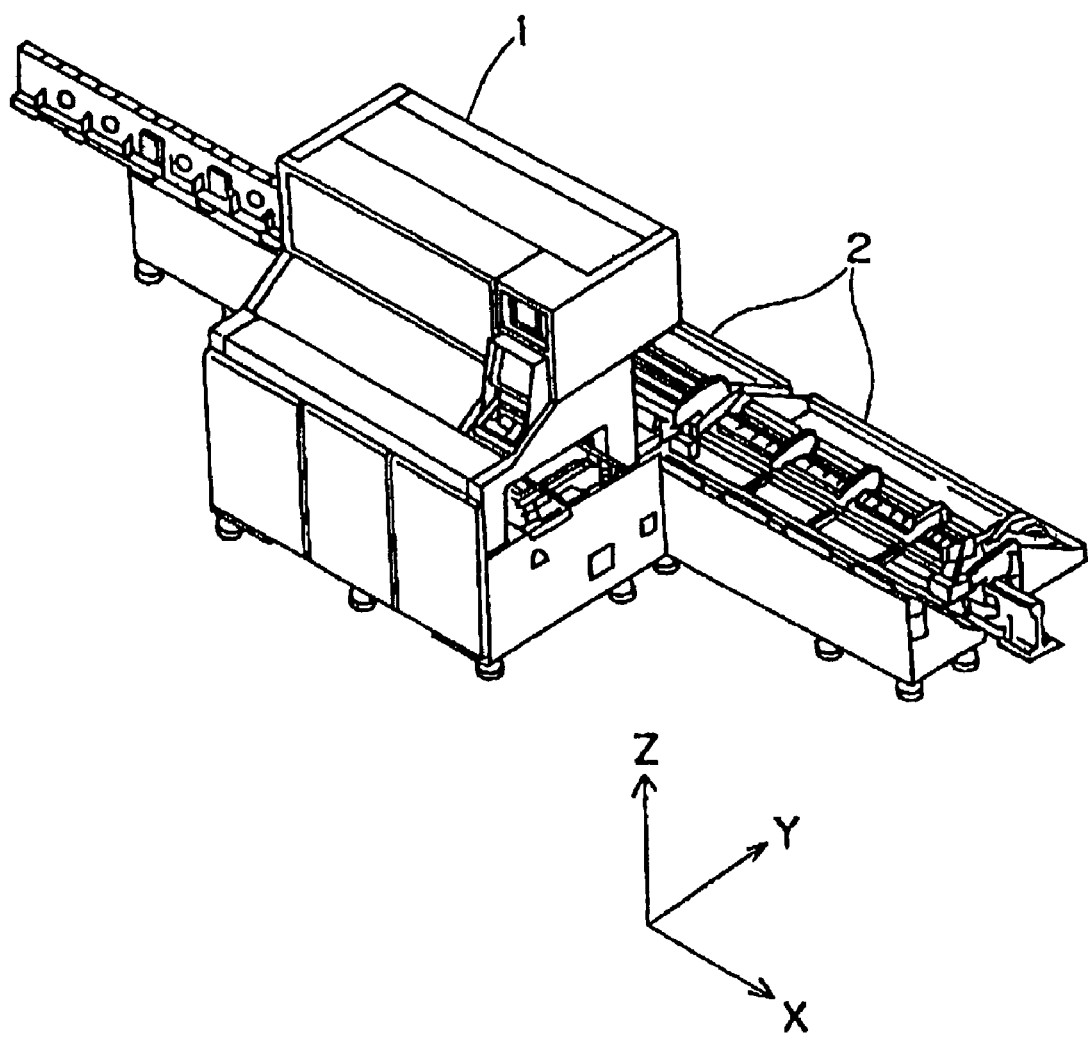
FIG. 5 is a perspective view of a conventional component mounting apparatus.
Figure 6:
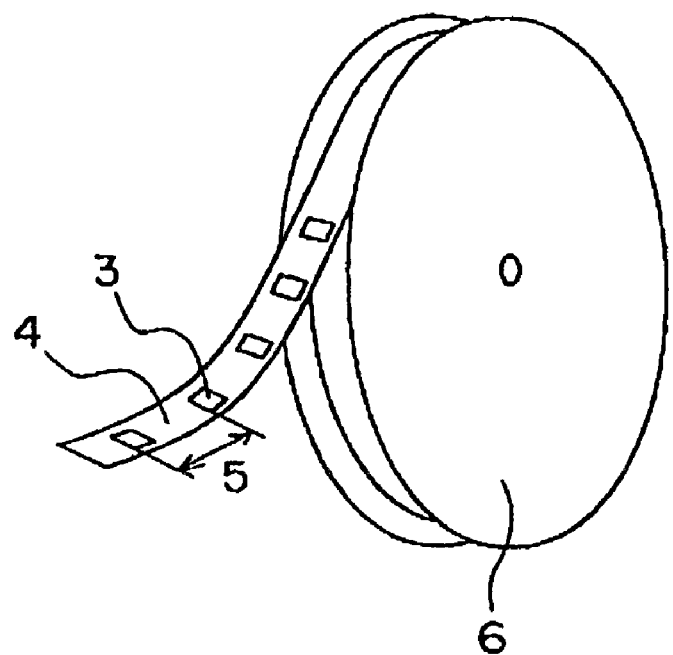
FIG. 6(A) shows a reel carrying a tape wound thereon for component mounting according to prior art.
FIG. 6(B) shows a cassette for supplying components to a part mounting apparatus according to prior art.
Figure 6:
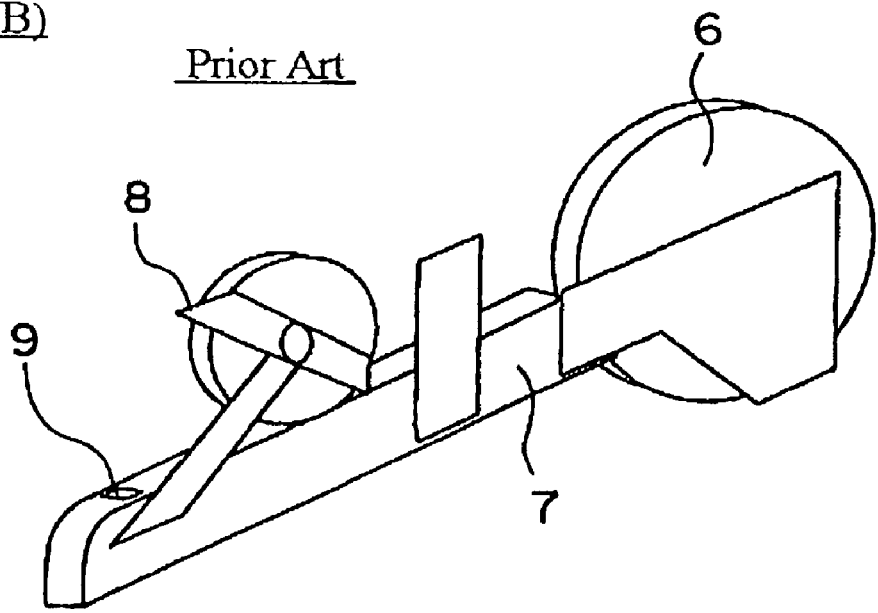

A fifth embodiment of the present invention is related to a computer readable storage medium which stores a program for performing a method of component mounting as described in each of the aforementioned embodiments. FIG. 4 is a circuit diagram showing various parts incorporated in respective component mounting apparatus described above. The component mounting system has a hardware section and a software section. The hardware section includes component supply 2, index 11, placement head 12, condition sensor 17, imaging device 18, and a circuit substrate holder. The software section includes various processing units for controlling necessary operations for supplying components, sucking components, measuring tilt angle correction amounts, determining component holding conditions, imaging components, recognizing sucking positions, and correcting positions. The hardware and software are integrated with a controller that controls overall operations of hardware and software elements. Each of the hardware elements whose operations are already described above has various drivers connected through respective lines extending from the elements. The controller processes and controls all of operations based on processing and determinations made by each of the software elements shown in the left side of FIG. 4

Among other things, a component supply processing unit controls movement of the component supply 2 so that component 3 is properly placed at a pick up position. A component sucking processing unit controls timing and vacuum for component sucking by nozzles 14 attached to placement heads 12. A unit for measuring tilt angle corrections measures an amount of angular correction ($\theta$ angle) about a central axis of nozzle 14 for mounting component 3 on a predetermined position by use of placement head 12. A unit for determining a component holding condition determines whether sucked component 3 is in a proper condition for mounting. A component recognition unit controls recognition by the imaging device and a field of the imaging device. A unit for detecting a target point of the circuit substrate recognizes the target point. A position correction unit controls a moving distance of the circuit substrate holder for mounting a component at a proper mounting position.

The computer readable storage medium according to the present embodiment stores a program for performing a method of component mounting by using the component mounting apparatus as structured above. Namely, the storage medium stores a program performing a series of operations in a proper order including steps of:

sucking predetermined components 3 from the component supply 2 using a single or a plurality of nozzles 14;

detecting whether or not component(s) 3 held by the nozzle(s) 14 is (are) in proper condition for mounting;

if it is determined that a component is held in proper condition for mounting, performing a series of operations including recognizing sucking point 31 of component 3, measuring a displacement value between nozzle 14 and the sucking point 31 of the component 3 as well as a tilt angle of the component 3, making necessary corrections to location and/or angle, and mounting the component 3 onto a predetermined position of the circuit substrate;

if it is determined that a component is held in an improper condition for mounting, or the component is not properly imaged during an imaging process, performing a series of operations including releasing the component into collecting box 23 at predetermined releasing station 22 instead of mounting it;

after the nozzle 14 has released the component, confirming whether any debris exists at the nozzle 14 before the nozzle 14 sucks a new component;

if no debris is found during the above confirming step, sucking a new component to be mounted with the nozzle 14;

if debris is found during the above confirming step, stopping the component mounting apparatus, and generating a warning for an operator, and after production operations are restarted upon removal of the debris from the nozzle 14, sucking a new component 3 for subsequent mounting with the nozzle 14. Since details of each of the steps included above are already described in the aforementioned embodiment, duplicated explanation may not be needed.

The computer readable storage medium as described above may store a program for performing further steps of:

immediately after starting of production operations, checking whether any debris exists at nozzle 14 before the nozzle 14 starts a component pick up operation to pick up a component from the component supply 2;

if no debris is found during the above checking step, picking up a first component 3 to be mounted;

if debris is found during the above detecting step, stopping the production operations, and after the production operations are restarted upon removal of the debris, picking up a first component 3 to be mounted with the nozzle 14.

The computer readable storage medium as described above may also store a program for performing further steps of:

after production operations are restarted and before the nozzle 14 picks up a new component, reconfirming whether any debris exists at the nozzle 14;

if no debris is found at the nozzle 14 during the above reconfirming step, picking up a new component 3 by the nozzle 14, and if debris is found during the above reconfirming step, stopping the production operations again.

The programs described above may be stored in a storage medium, such as a floppy disc or a CD-ROM. A device capable of reading such a storage medium is provided for the component mounting apparatus, and such a device reads the programs so that the programs may be stored in the memory of the controller of the component mounting apparatus. Consequently, the component mounting apparatus may perform operations defined by such a program, and hence a method of component mounting according to the present invention as described in each of the precedent embodiments may be performed.

In the description of the present embodiment, a nozzle 14 is used as an example of the component holder, but other types of component holders such as a mechanical chuck type may be used.

As described above, according to the method and apparatus for component mounting of the present invention, whether any debris exists at a component holder or not, or whether an unnecessary component is certainly released or not may be checked and confirmed by using a detecting device. Such a detecting device needs not to be additionally provided for the component mounting apparatus, but rather detecting devices, such as a condition sensor or an imaging device already provided with the component mounting apparatus, may be utilized. If the debris is found by such a detecting device, the debris may be removed either manually by an operator who stops the component mounting apparatus and cleans it, or automatically by a debris removing device using compressed air or brush like material for removing the debris. If it is necessary, a reconfirming procedure to determine whether or not the debris still exists may be performed by using the same detecting device. By performing the production operations as described above, defective products may rarely be produced, and hence a yield, or a ratio of non-defective products may be improved. Further, the method according to the present invention may avoid damage to the component holder, and hence avoid deterioration of productivity due to unnecessary mechanical problems of the apparatus.

According to the present invention, by decelerating a moving speed of the component holder until it reaches a releasing station for releasing a component held in an improper condition, it is possible to reduce risks of falling of the component held by the component holder in an unstable condition. Therefore, according to the method or the apparatus for component mounting of the present invention, producing circuit boards with higher quality may be realized more stably.

Further, by reading the storage medium by a computer, and controlling component mounting operations by using such a computer, defective products may rarely be produced during the component mounting operations. Therefore, the component mounting operations according to the present invention may improve a yield, or a ratio of non-defective products, and may avoid deterioration of productivity due to unnecessary mechanical problems of the apparatus.

What is claimed is:

1. A component mounting method for performing production operations, comprising:
   checking to determine whether any debris exists at a component holder immediately after performance of the production operations begins, and when this checking indicates that debris exists at said component holder,
      (i) stopping performance of the production operations and removing said debris,
      (ii) restarting performance of the production operations, and
      (iii) confirming whether any other debris exists at said component holder immediately after performance of the production operations is restarted; then
   using said component holder to pick up a component supplied to a component supply;
   detecting a holding condition of said component when held by said component holder; and
      when the holding condition as detected indicates that said component is held in an improper condition for mounting, releasing said component at a releasing station and then confirming whether any debris exists at said component holder prior to using said component holder to pick up another component supplied to said component supply.

2. The method according to claim 1, wherein
   detecting a holding condition of said component comprises using a detecting device to detect said holding condition, and
   confirming whether any debris exists at said component holder, checking to determine whether any debris exists at said component holder, or confirming whether any other debris exists at said component holder, comprises using said detecting device to ascertain such debris existence.

3. A component mounting method for performing production operations, comprising:
   using a component holder to pick up a component supplied to a component supply;
   detecting a holding condition of said component when held by said component holder; and
      when the holding condition as detected indicates that said component is held in an improper condition for mounting, releasing said component at a releasing station and then confirming whether any debris exists at said component holder prior to using said component holder to pick up another component supplied to said component supply, and then
         (a) when there is confirmation that no debris exists at said component holder, using said component holder to pick up said another component, or
         (b) when there is confirmation that debris exists at said component holder,
            (1) stopping performance of the production operations and removing said debris,
            (2) restarting performance of the production operations, and then
            (3) using said component holder to pick up said another component.

4. The method according to claim 3, further comprising:
   checking to determine whether any debris exists at said component holder immediately after performance of the production operations is started and prior to using said component holder to pick up said component;
      (i) when this checking indicates that no debris exists at said component holder, using said component holder to pick up said component, or
      (ii) when this checking indicates that debris exists at said component holder,
         (1) stopping performance of the production operations and removing said debris,
         (2) restarting performance of the production operations, and then
         (3) using said component holder to pick up said component.

5. The method according to claim 4, further comprising:
   when the checking indicates that debris exists at said component holder, confirming whether any other debris exists at said component holder after the restarting of the performance of the production operations.

6. The method according to claim 4, further comprising:
   when there is confirmation that debris exists at said component holder, confirming whether any other debris exists at said component holder after the restarting of the performance of the production operations.

7. The component mounting method according to claim 3, wherein
   using a component holder to pick up a component supplied to a component supply comprises using to pick up said component a component holder of a rotary component mounting apparatus that is for performing a series of repetitive production operations in a regular sequence.

8. The method according to claim 7, further comprising:
   checking to determine whether any debris exists at said component holder immediately after performance of the production operations is started and prior to using said component holder to pick up said component;
      (i) when this checking indicates that no debris exists at said component holder, using said component holder to pick up said component, or
      (ii) when this checking indicates that debris exists at said component holder,
         (1) stopping performance of the production operations and removing said debris,
         (2) restarting performance of the production operations, and then
         (3) using said component holder to pick up said component.

9. The method according to claim 8, further comprising:
   when the checking indicates that debris exists at said component holder, confirming whether any other debris exists at said component holder after the restarting of the performance of the production operations.

10. The method according to claim 8, further comprising:
   when there is confirmation that debris exists at said component holder, confirming whether any other debris exists at said component holder after the restarting of the performance of the production operations.

* * * * *